United States Patent
Ohnishi et al.

(10) Patent No.: US 8,466,483 B2
(45) Date of Patent: Jun. 18, 2013

(54) EPOXY RESIN COMPOSITION FOR OPTICAL SEMICONDUCTOR DEVICE, LEAD FRAME OBTAINED USING THE SAME FOR OPTICAL SEMICONDUCTOR DEVICE, AND OPTICAL SEMICONDUCTOR DEVICE

(75) Inventors: Hidenori Ohnishi, Osaka (JP); Kohei Nakamura, Osaka (JP); Kazuhiro Fuke, Osaka (JP); Shinya Ota, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/243,397

(22) Filed: Sep. 23, 2011

(65) Prior Publication Data
US 2012/0080705 A1   Apr. 5, 2012

(30) Foreign Application Priority Data
Oct. 5, 2010   (JP) .................. 2010-225657

(51) Int. Cl.
*H01L 29/22* (2006.01)
(52) U.S. Cl.
USPC .. 257/98; 257/99; 257/E33.059; 257/E33.072
(58) Field of Classification Search
USPC ....... 257/98, 99, E33.055, E33.056, E33.059, 257/E33.06, E33.067, E33.072
See application file for complete search history.

(56) References Cited

U.S. PATENT DOCUMENTS

| 8,080,436 | B2 * | 12/2011 | Sugiyama | 438/34 |
| 2002/0132108 | A1 | 9/2002 | Ikegawa et al. | |
| 2009/0268279 | A1 | 10/2009 | Higuchi | |
| 2011/0058776 | A1 * | 3/2011 | Taniguchi et al. | 385/88 |
| 2011/0241055 | A1 * | 10/2011 | Urasaki et al. | 257/98 |
| 2012/0018772 | A1 * | 1/2012 | Nishijima et al. | 257/99 |
| 2012/0217532 | A1 * | 8/2012 | Fuke et al. | 257/99 |

FOREIGN PATENT DOCUMENTS

| EP | 2 233 507 A1 | 9/2010 |
| EP | 2 371 888 A2 | 10/2011 |
| JP | 2002-232017 A | 8/2002 |
| JP | 2002-283498 A | 10/2002 |
| WO | 2007/086668 A1 | 8/2007 |

OTHER PUBLICATIONS

European Search Report dated Feb. 14, 2012 issued by the European Patent Office in counterpart European Patent Application No. 11183950.2.

* cited by examiner

*Primary Examiner* — Matthew E Warren
(74) *Attorney, Agent, or Firm* — Sughrue Mion, PLLC

(57) ABSTRACT

The present invention relates to an epoxy resin composition for an optical semiconductor device having an optical semiconductor element mounting region and having a reflector that surrounds at least a part of the region, the epoxy resin composition being an epoxy resin composition for forming the reflector, the epoxy resin composition including the following ingredients (A) to (D): (A) an epoxy resin; (B) a curing agent; (C) a white pigment; and (D) at least one antioxidant selected from the group consisting of hindered-phenol antioxidants, sulfide antioxidants and hindered-amine antioxidants.

8 Claims, 2 Drawing Sheets

EPOXY RESIN COMPOSITION FOR OPTICAL SEMICONDUCTOR DEVICE, LEAD FRAME OBTAINED USING THE SAME FOR OPTICAL SEMICONDUCTOR DEVICE, AND OPTICAL SEMICONDUCTOR DEVICE

FIELD OF THE INVENTION

The present invention relates to an epoxy resin composition for an optical semiconductor device which is useful as a material for forming reflectors (reflection parts) that reflect light emitted, for example, from optical semiconductor elements. The invention further relates to a lead frame for an optical semiconductor device, obtained using the epoxy resin composition and to an optical semiconductor device.

BACKGROUND OF THE INVENTION

Conventional optical semiconductor devices including an optical semiconductor element mounted therein have a configuration including a metallic lead frame 1, an optical semiconductor element 2 mounted thereon, and a reflector 3 for light reflection formed from a resinous material so as to surround the optical semiconductor element 2, as shown in FIG. 1. The space including the optical semiconductor element 2 surrounded by the reflector 3 is encapsulated with a transparent resin such as a silicone resin. In FIG. 1, numeral 4 denotes a bonding wire which electrically connects an electrode circuit (not shown) formed on the metallic lead frame 1 to the optical semiconductor element 2, the bonding wire being disposed according to need.

When such an optical semiconductor device is produced, the reflector 3 is formed by the injection molding of a thermoplastic resin represented by a polyphthalamide resin (PPA) or the like. A white pigment is generally incorporated into the thermoplastic resin to reflect the light emitted by the optical semiconductor element 2 (see patent document 1).

On the other hand, when high heat resistance is required, a ceramic material containing sintered alumina is mainly used to form a part corresponding to the reflector 3 (see patent document 2). There are cases where the formation of a part corresponding to the reflector 3 from such a ceramic material is problematic in view of the suitability for mass production and cost of such packages, etc. Because of this, the reflector 3 is generally formed using a thermoplastic resin as described above.

In the case where thermoplastic resins are used as materials for forming the reflector 3, the following problems arise. Recently, the solder materials for use in mounting are becoming lead-free solder materials, which have higher melting points. As a result, the thermoplastic resins have come to be required to have thermal resistance to high-temperature reflow environments in surface mount packages such as the optical semiconductor device. Consequently, although there are desires for thermal deformation resistance at soldering temperatures in package production and for longer-period heat resistance which is required due to increases in the power of optical semiconductor elements 2, use of the thermoplastic resins results in discoloration, etc. at high temperatures and this poses problems such as a decrease in the efficiency of light reflection.

When a thermosetting resin is used as a material for forming the reflector 3 in order to overcome those problems, it is possible to obtain excellent thermal discoloration resistance and satisfactory light-reflecting properties.
Patent Document 1: JP-A-2002-283498
Patent Document 2: JP-A-2002-232017

SUMMARY OF THE INVENTION

When a thermosetting resin is used as a material for forming the reflector 3, an antioxidant is usually incorporated thereinto to prepare a thermosetting resin composition. However, when a silicone resin is used for resin encapsulation of an optical semiconductor device as described above, the following problem arises. Namely, the resin encapsulation results in a problem that curing inhibition occurs at the interface between the reflector 3 formed from the thermosetting resin composition and the cured silicone resin used for the resin encapsulation.

An object of the invention, which has been achieved in view of such circumstances, is to provide an epoxy resin composition for an optical semiconductor device which gives a reflector that has excellent heat resistance and can have satisfactory light-reflecting properties and that does not cause curing inhibition at the interface between the reflector and an encapsulating resin such as a silicone resin. Another object of the invention is to provide a lead frame obtained using the epoxy resin composition, for an optical semiconductor device. Still another object thereof is to provide an optical semiconductor device.

Namely, the present invention relates to the following items 1 to 8.

1. An epoxy resin composition for an optical semiconductor device having an optical semiconductor element mounting region and having a reflector that surrounds at least a part of the region, the epoxy resin composition being an epoxy resin composition for forming the reflector, the epoxy resin composition including the following ingredients (A) to (D):
   (A) an epoxy resin;
   (B) a curing agent;
   (C) a white pigment; and
   (D) at least one antioxidant selected from the group consisting of hindered-phenol antioxidants, sulfide antioxidants and hindered-amine antioxidants.

2. The epoxy resin composition for an optical semiconductor device according to item 1, in which the ingredient (D) is contained in an amount of 0.01 to 10 parts by weight per 100 parts by weight of the epoxy resin as the ingredient (A).

3. The epoxy resin composition for an optical semiconductor device according to item 1 or 2, in which the white pigment as the ingredient (C) is titanium oxide.

4. The epoxy resin composition for an optical semiconductor device according to any one of items 1 to 3, which further contains an inorganic filler in addition to the ingredients (A) to (D).

5. The epoxy resin composition for an optical semiconductor device according to any one of items 1 to 4, in which a surface of the reflector formed from the epoxy resin composition has a light reflectivity of 80% or higher in a wavelength range of from 450 to 800 nm.

6. A lead frame for an optical semiconductor device, the lead frame having an optical semiconductor element mounting region and having a reflector that surrounds at least a part of the region,
in which the reflector is formed from the epoxy resin composition for an optical semiconductor device according to any one of items 1 to 5.

7. An optical semiconductor device including:
the lead frame for an optical semiconductor device according to item 6; and
an optical semiconductor element mounted on a predetermined position in the lead frame.

8. The optical semiconductor device according to item 7, in which a region including the optical semiconductor element surrounded by the reflector is encapsulated with a silicone resin.

The present inventors diligently made investigations in order to obtain a material for forming a reflector which is inhibited from suffering thermal deformation or discoloration and has excellent light-reflecting properties and which does not cause curing inhibition at the interface between the reflector and an encapsulating resin such as a silicone resin. In the course of the investigations, the inventors directed attention to the antioxidants, which are one class of compounding ingredients for epoxy resin compositions as thermosetting resin compositions, on the assumption that an antioxidant may be causative of the curing inhibition, and the inventors made investigations mainly on the antioxidants. As a result, the inventors found that use of phosphine antioxidants which had conventionally been used results in the curing inhibition. Based on this finding, the inventors made further investigations in order to find out an antioxidant which does not cause the curing inhibition. As a result, the inventors have found that the desired objects are accomplished when the specific antioxidant is used. The invention has been thus achieved.

As shown above, the invention provides an epoxy resin composition for an optical semiconductor device which contains a specific antioxidant (ingredient (D)) besides an epoxy resin (ingredient (A)), a curing agent (ingredient (B)), and a white pigment (ingredient (C)). Because of this, the reflector obtained from this resin composition exhibits excellent heat resistance at high temperatures and is prevented from causing curing inhibition at the interface between an encapsulating resin and the reflector because the specific antioxidant (ingredient (D)) was used. Excellent long-term high-temperature heat resistance is hence exhibited, and excellent light-reflecting properties are possible. Consequently, in an optical semiconductor device equipped with a reflector formed using the epoxy resin composition for an optical semiconductor device, a satisfactory light reflectivity attributable to the reflector is maintained over a longer period of time and, hence, the reflector can sufficiently perform the function thereof.

When the content of the specific antioxidant (ingredient (D)) is within a specific range, curing inhibition at the interface between the reflector and an encapsulating resin is more effectively prevented, and the device obtained has even higher thermal discoloration resistance.

Furthermore, the incorporation of an inorganic filler brings about the effect of reducing the linear expansion coefficient and the effect of improving flowability.

DETAILED DESCRIPTION OF THE INVENTION

Figure 1:
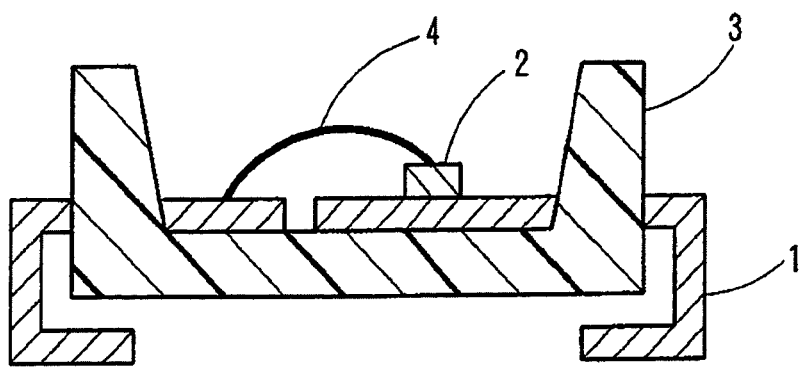
FIG. 1 is a sectional view diagrammatically illustrating a configuration of the optical semiconductor device of the invention.

As stated above, the epoxy resin composition for an optical semiconductor device (hereinafter referred to also as "epoxy resin composition") of the invention may be used as a material for forming the reflector 3 of the optical semiconductor device shown in FIG. 1. The resin composition is obtained using an epoxy resin (ingredient (A)), a curing agent (ingredient (B)), a white pigment (ingredient (C)), and a specific antioxidant (ingredient (D)), and is usually supplied as a molding material in a liquid or powder state or in the form of tablets obtained by tableting the powder.

Examples of the epoxy resin (ingredient (A)) include bisphenol A epoxy resins, bisphenol F epoxy resins, bisphenol S epoxy resins, novolac epoxy resins such as phenol-novolac epoxy resins and cresol-novolac epoxy resins, alicyclic epoxy resins, nitrogenous-ring epoxy resins such as monoglycidyl isocyanurate, diglycidyl isocyanurate, triglycidyl isocyanurate, and hydantoin epoxy resins, hydrogenated bisphenol A epoxy resins, hydrogenated bisphenol F epoxy resins, aliphatic epoxy resins, glycidyl ether epoxy resins, diglycidyl ethers of alkyl-substituted bisphenols or the like, glycidylamine epoxy resins obtained by the reaction of polyamines, e.g., diaminodiphenylmethane and isocyanuric acid, with epichlorohydrin, linear aliphatic epoxy resins obtained by oxidizing olefin bonds with a peracid, e.g., peracetic acid, biphenyl epoxy resins, which are mainly used as the type giving cured resins with a low water absorption, dicyclic epoxy resins, and naphthalene epoxy resins. These may be used alone or in combination of two or more thereof. To use alicyclic epoxy resins and triglycidyl isocyanurate either alone or in combination is preferred of those epoxy resins because of their excellent transparency, discoloration resistance, and melt-mixability with the other ingredients. For the same reason, the diglycidyl esters of dicarboxylic acids such as phthalic acid, tetrahydrophthalic acid, hexahydrophthalic acid, methyltetrahydrophthalic acid, nadic acid, and methylnadic acid are also suitable. Examples of the epoxy resin further include glycidyl esters having an alicyclic structure formed by the hydrogenation of an aromatic ring, such as nuclear-hydrogenated trimellitic acid and nuclear-hydrogenated pyromellitic acid.

The epoxy resin (ingredient (A)) may be solid or liquid at ordinary temperature. In general, however, it is preferred to use an epoxy resin having an average epoxy equivalent of 90 to 1,000. In the case of solid epoxy resins, it is preferred to use an epoxy resin having a softening point of 160° C. or lower. The reasons for these are as follows. Too low epoxy equivalents may result in cases where the epoxy resin composition gives a brittle cured material. When the epoxy resin has too high an epoxy equivalent, the epoxy resin composition tends to give a cured material having a lowered glass transition temperature (Tg).

Examples of the curing agent (ingredient (B)) include acid anhydride curing agents and isocyanuric acid derivative curing agents. Examples of the acid anhydride curing agents include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, and methyltetrahydrophthalic anhydride. These may be used alone or in combination of two or more thereof. Of these acid anhydride curing agents, it is preferred to use phthalic anhydride, hexahydrophthalic anhydride, tetrahydrophthalic anhydride, or methylhexahydrophthalic anhydride. Preferred acid anhydride curing agents are colorless or pale-yellow acid anhydride curing agents.

Examples of the isocyanuric acid derivative curing agents include 1,3,5-tris(1-carboxymethyl) isocyanurate, 1,3,5-tris (2-carboxyethyl) isocyanurate, 1,3,5-tris(3-carboxypropyl) isocyanurate, and 1,3-bis(2-carboxyethyl) isocyanurate.

These may be used alone or in combination of two or more thereof. Preferred isocyanuric acid derivative curing agents are colorless or pale-yellow curing agents.

Curing agents (ingredient (B)) such as the acid anhydride curing agents and isocyanuric acid derivative curing agents may be used alone or in combination of two or more thereof as stated above. Preferred curing agents (ingredient (B)) are ones which are colorless or pale-yellow.

The proportion of the epoxy resin (ingredient (A)) to the curing agent (ingredient (B)) is set so that the amount of active groups (acid anhydride groups or carboxyl groups) in the curing agent (ingredient (B)) which are capable of reacting with an epoxy group is preferably 0.5 to 1.5 equivalents, more preferably 0.7 to 1.2 equivalents, per one equivalent of the epoxy groups contained in the epoxy resin (ingredient (A)). The reasons for this are as follows. In the case where the amount of active groups is too small, there is a tendency that the epoxy resin composition has a reduced curing rate and gives a cured material having a lowered glass transition temperature (Tg). In the case where the amount of active groups is too large, moisture resistance tends to decrease.

Curing agents for epoxy resins, other than the acid anhydride curing agents and isocyanuric acid derivative curing agents described above, may be used as the curing agent (ingredient (B)) according to the purpose and use thereof. Examples of such other curing agents include phenol curing agents, amine curing agents, curing agents obtained by partly esterifying the acid anhydride curing agents with an alcohol, and carboxylic acids such as hexahydrophthalic acid, tetrahydrophthalic acid, and methylhexahydrophthalic acid. These may be used alone or in combination of two or more thereof. For example, when a carboxylic acid curing agent is used in combination with another curing agent, this can heighten the curing rate and can improve productivity. Also in the case where the curing agents are used, the proportion thereof may be the same as the proportion (equivalent ratio) of the curing agent (ingredient (B)) shown above.

Examples of the white pigment (ingredient (C)) to be used together with the ingredient (A) and ingredient (B) described above include inorganic white pigments such as magnesium oxide, antimony oxide, titanium oxide, zirconium oxide, zinc oxide, white lead, kaolin, alumina, calcium carbonate, barium carbonate, barium sulfate, zinc sulfate, and zinc sulfide. These may be used alone or in combination of two or more thereof. Especially preferred of these is titanium oxide from the standpoint that an excellent light reflectivity is obtained therewith. It is especially preferred to use titanium oxide having a rutile-form crystal structure. From the standpoints of flowability and light-shielding properties, it is preferred to use rutile-form titanium oxide which has an average particle diameter of 0.05 to 2.0 μm. From the standpoint of light-reflecting properties, the average particle diameter thereof is especially preferably 0.08 to 0.5 μm. Incidentally, the average particle diameter can be determined with, for example, a laser diffraction/scattering particle size distribution analyzer.

The content of the white pigment (ingredient (C)) is preferably 5 to 90% by weight based on the whole epoxy resin composition. From the standpoints of coloring properties and light-reflecting properties, it is especially preferred that the content thereof should be 10 to 80% by weight based on the whole epoxy resin composition. The reasons for this are as follows. In the case where the content of ingredient (C) is too low, there is a tendency that a sufficient light reflectivity is difficult to obtain. In the case where the content of ingredient (C) is too high, there is a possibility that difficulties might be encountered in producing the epoxy resin composition through kneading or the like because of a considerable increase in viscosity.

As the specific antioxidant (ingredient (D)) to be used together with the ingredients (A) to (C), hindered-phenol antioxidants, sulfide antioxidants and hindered-amine antioxidants may be mentioned. These may be used alone or in combination of two or more thereof. Specifically, examples of the hindered-phenol antioxidants include 2,6-di-t-butyl-4-methylphenol, triethylene glycol bis[3-(3-t-butyl-5-methyl-4-hydroxyphenyl)propionate], 1,6-hexanediol bis[3-(3,5-di-t-butyl-4-hydroxyphenyl)propionate], 2,4-bis(n-octylthio)-6-(4-hydroxy-3,5-di-t-butylanilino)-1,3,5-triazine, pentaerythrityl tetrakis[3-(3,5-di-t-butyl-4-hydroxyphenyl) propionate], 2,2-thiodiethylene bis[3-(3,5-di-t-butyl-4-hydroxyphenyl)propionate], octadecyl 3-(3,5-di-t-butyl-4-hydroxyphenyl)propionate, N,N'-hexamethylene(3,5-di-t-butyl-4-hydroxyhydrocinnamamide), diethyl 3,5-di-t-butyl-4-hydroxybenzylphosphonate, and 1,3,5-trimethyl-2,4,6-tris (3,5-di-t-butyl-4-hydroxybenzyl)benzene. Examples of the sulfide antioxidants include alkyl esters of thiopropionic acid, alkylpropionic acid esters of thiobisphenols, mercaptobenzimidazole, and derivatives thereof. Examples of the hindered-amine antioxidants include bis(2,2,6,6-tetramethyl-4-piperidyl) sebacate, bis(1,2,2,6,6-pentamethyl-4-piperidyl) sebacate, 1,2,3,4-tetrakis(2,2,6,6-tetramethyl-4-piperidyloxycarbonyl)butane, succinic acid/dimethyl-1-(2-hydroxyethyl-4-hydroxy-2,2,6,6-tetramethylpiperidine polycondensates, 1-(3,5-di-t-butyl-4-hydroxyphenyl)-1,1-bis(2,2,6,6-tetramethyl-4-piperidyloxycarbonyl)pentane, N,N-bis(3-aminopropyl)ethylenediamine, 4-benzoyloxy-2,2,6,6-tetramethylpiperidine, and bis(octyl-2,2,6,6-tetramethyl-4-piperidyl) sebacate. From the standpoints of preventing curing inhibition to attain excellent long-term high-temperature heat resistance and enabling the cured material to exhibit excellent light-reflecting properties, it is preferred to use a hindered-phenol antioxidant among those. In particular, it is preferred to use 2,6-di-t-butyl-4-methylphenol.

The content of the specific antioxidant (ingredient (D)) is preferably 0.01 to 10 parts by weight, more preferably 0.1 to 5 parts by weight, per 100 parts by weight of the epoxy resin (ingredient (A)). This is because too low or too high contents of the ingredient (D) which are outside the range tend to result in a decrease in thermal discoloration resistance.

In the epoxy resin composition of the invention, an inorganic filler can be used together with the ingredients (A) to (D) for the purposes of reducing the linear expansion coefficient and improving flowability. Examples of the inorganic filler include a quartz glass powder, talc, silica powders such as a powder of fused silica and a powder of crystalline silica, aluminum nitride powder, and silicon nitride powder. Of these, it is preferred to use a silica powder from the standpoints of reducing the linear expansion coefficient, etc. Especially from the standpoints of high-loading characteristics and high flowability, it is preferred to use a spherical powder of fused silica. With respect to the particle diameter and particle diameter distribution of the inorganic filler, it is preferred to set the particle diameter and distribution thereof so that a combination thereof with the particle diameter and particle diameter distribution of the white pigment (ingredient (C)) is effective in minimizing the occurrence of burrs when the epoxy resin composition is molded by transfer molding, etc. Specifically, it is preferred that the average particle diameter of the inorganic filler should be in the range of 5 to 60 μm.

It is preferred that the content of the inorganic filler should be set so that the total content of the white pigment (ingredient (C)) and the inorganic filler is 10 to 98% by weight based on the whole epoxy resin composition. Especially preferably, the total content thereof is 15 to 45% by weight.

Various additives such as a curing accelerator, modifier, flame retardant, defoaming agent, leveling agent, and release agent can be suitably incorporated into the epoxy resin composition of the invention according to need in addition to the ingredients (A) to (D) and inorganic filler described above.

Examples of the curing accelerator include tertiary amines such as 1,8-diazabicyclo[5.4.0]undecene-7, triethylenediamine, tri-2,4,6-dimethylaminomethylphenol, N,N-dimethylbenzylamine, N,N-dimethylaminobenzene, and N,N-dimethylaminocyclohexane, imidazole compounds such as 2-ethyl-4-methylimidazole and 2-methylimidazole, phosphorus compounds such as triphenylphosphine, tetraphenylphosphonium tetraphenylborate, and tetra-n-butylphosphonium o,o-diethyl phosphorodithioate, quaternary ammonium salts, organic metal salts, and derivatives thereof. These may be used alone or in combination of two or more thereof. Preferred of these curing accelerators are tertiary amines, imidazole compounds, and phosphorus compounds. It is especially preferred to use phosphorus compounds, among these curing accelerators, from the standpoint of obtaining a cured material which has a low degree of coloration and is transparent and tough.

It is preferred that the content of the curing accelerator should be set at 0.001 to 8.0% by weight based on the epoxy resin (ingredient (A)). More preferably, the content thereof is 0.01 to 3.0% by weight. The reasons for this are as follows. When the content of the curing accelerator is too low, there are cases where a sufficient curing-accelerating effect is not obtained. When the content of the curing accelerator is too high, the cured material obtained tends to discolor.

Examples of the flame retardant include metal hydroxides such as magnesium hydroxide, bromine-compound flame retardants, nitrogen-compound flame retardants, and phosphorus-compound flame retardants. Also usable is a flame retardant aid such as antimony trioxide.

Examples of the modifier include conventionally known modifiers such as glycols, silicones, and alcohols.

Examples of the defoaming agent include conventionally known defoaming agents such as silicones.

The epoxy resin composition of the invention can be produced, for example, in the following manner. Namely, the ingredients (A) to (D) described above are mixed suitably together with an inorganic filler and a polyorganosiloxane and optionally further with the various additives according to need. Thereafter, these ingredients are kneaded and melt-mixed by a kneader or the like. The resultant mixture is pulverized.

Thus, a powdery epoxy resin composition can be produced.

The epoxy resin composition obtained above gives a cured material having a light reflectivity of preferably 80% or higher, more preferably 90% or higher, in a wavelength range of from 450 to 800 nm. The upper limit of the light reflectivity thereof is usually 100%. The light reflectivity is measured, for example, in the following manner. A 1 mm-thick cured material of the epoxy resin composition is produced under predetermined curing conditions, for example, molding at 150° C. for 4 minutes and subsequent curing at 150° C. for 5 hours. The reflectivity of this cured material at a wavelength within that range can be measured with a spectrophotometer (e.g., Spectrophotometer V-670, manufactured by JASCO Corp.) at room temperature (25±10° C.).

The optical semiconductor device obtained using the epoxy resin composition of the invention is produced, for example, in the following manner. Namely, a metallic lead frame is disposed within a mold of a transfer molding machine, and the epoxy resin composition is used to form a reflector by transfer molding. The reflector is formed so as to surround a region where an optical semiconductor element is to be mounted. Thus, a metallic lead frame for an optical semiconductor device is fabricated. Subsequently, an optical semiconductor element is mounted on the optical semiconductor element mounting region which is located on the metallic lead frame and inside the reflector, and wire bonding is conducted according to need. Thus, an optical semiconductor device is fabricated, the device being a unit equipped with a metallic lead frame 1 having a reflector 3 and with an optical semiconductor element 2 mounted on the metallic lead frame 1, the reflector 3 having been formed so as to surround the optical semiconductor element 2, as shown in FIG. 1. In FIG. 1, numeral 4 denotes a bonding wire which electrically connects an electrode circuit (not shown) formed on the metallic lead frame 1 to the optical semiconductor element 2. In this optical semiconductor device, the region which is located inside the reflector 3 and which includes the optical semiconductor element 2 is encapsulated with a silicone resin or the like.

Figure 2:
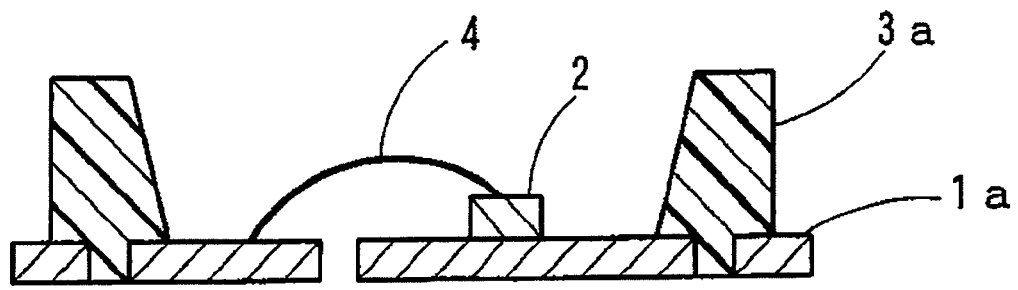
FIG. 2 is a sectional view diagrammatically illustrating another configuration of the optical semiconductor device of the invention.
Figure 3:
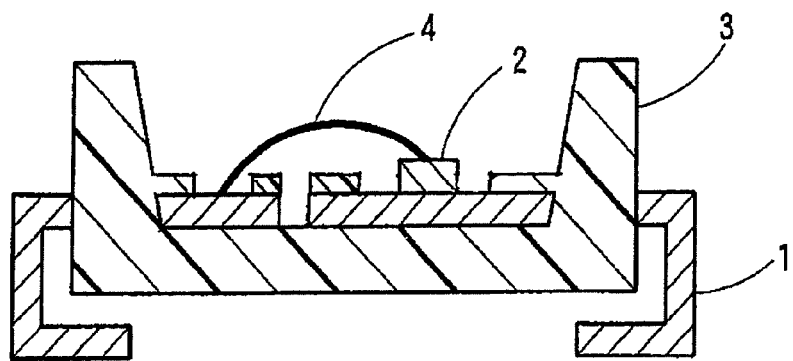
FIG. 3 is a sectional view diagrammatically illustrating still another configuration of the optical semiconductor device of the invention.
Figure 4:
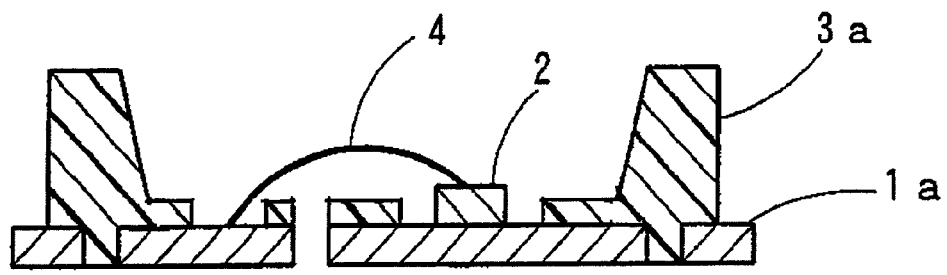
FIG. 4 is a sectional view diagrammatically illustrating a further configuration of the optical semiconductor device of the invention.

Other configurations of the optical semiconductor device are shown in FIG. 2 to FIG. 4. In the optical semiconductor device shown in FIG. 2, a reflector 3a has been formed only on the metallic lead frame 1a (or substrate) on which an optical semiconductor element 2 has been mounted. The optical semiconductor device shown in FIG. 3 has substantially the same configuration as the optical semiconductor device shown in FIG. 1. In the optical semiconductor device shown in FIG. 3, however, a reflector 3 has been formed also on the area of the metallic lead frame 1 which is located at the periphery of the optical semiconductor element 2 and in the region within the reflector 3. The optical semiconductor device shown in FIG. 4 has substantially the same configuration as the optical semiconductor device shown in FIG. 2. In the optical semiconductor device shown in FIG. 4, however, a reflector 3a has been formed also on the area of the metallic lead frame 1a (or substrate) which is located at the periphery of the optical semiconductor element 2 and in the region within the reflector 3a. In these configurations of an optical semiconductor device which are shown in FIG. 2 to FIG. 4, the same parts as in the optical semiconductor device shown in FIG. 1 are designated by the same numerals and signs.

In the optical semiconductor devices shown in FIG. 2 and FIG. 4 according to the invention, various substrates may be used in place of the metallic lead frames 1a. Examples of the various substrates include organic substrates, inorganic substrates, and flexible printed wiring boards. The metallic lead frames 1a of the optical semiconductor device shown in FIG. 2 and FIG. 4 and such various substrates each have an electrode circuit (not shown) formed on the surface thereof.

EXAMPLES

Examples are given below together with Comparative Examples. However, the invention should not be construed as being limited to the following Examples.

First, prior to the production of epoxy resin compositions, the ingredients shown below were prepared.
[Epoxy Resin]
Triglycidyl isocyanurate (epoxy equivalent: 100)
[Curing Agent]
Methylhexahydrophthalic anhydride (acid equivalent: 168)
[Titanium Oxide]
Rutile-form; average particle diameter, 0.2 μm

[Silica Powder]
Spherical fused silica; average particle diameter, 23 μm
[Antioxidant d1]
9,10-Dihydro-9-oxa-10-phosphaphenanthrene-10-oxide
[Antioxidant d2]
2,6-Di-t-butyl-4-methylphenol
[Curing Accelerator]
Tetra-n-butylphosphonium o,o-diethyl phosphorodithioate Examples 1 to 4 and Comparative Examples 1 to 3

The ingredients shown in Table 1 given later were put together according to each of the formulations shown in the table, and were melt-mixed in a beaker. Each mixture was aged, subsequently cooled to room temperature (25° C.), and pulverized. Thus, desired powdery epoxy resin compositions were produced.

The epoxy resin compositions of Examples and Comparative Examples thus obtained were examined/evaluated for reflectivity (initial stage and after high-temperature standing) and for silicone resin curability. The results thereof are also shown in Table 1.

[Reflectivity]
Using each epoxy resin composition, test pieces having a thickness of 1 mm were produced under predetermined curing conditions (conditions: molding at 150° C. for 4 minutes and curing at 150° C. for 5 hours). The test pieces (cured materials) were examined for reflectivity in the initial stage and after 180° C. standing for 72 hours. Spectrophotometer V-670, manufactured by JASCO Corp., was used as a measuring apparatus, and the reflectivity of light having a wavelength of 450 to 800 nm was measured at room temperature (25° C.) to ascertain that a reflectivity of 80% or higher was retained throughout the whole range. The value of reflectivity at 450 nm is shown as a representative value.

[Silicone Resin Curability]
Using each epoxy resin composition, test pieces having a thickness of 1 mm were produced under predetermined curing conditions (conditions: molding at 150° C. for 4 minutes and curing at 150° C. for 5 hours). These test pieces (cured materials) were heated using a hot plate so that the surface of each test piece had a temperature of 150° C. A thermosetting silicone resin (KER-2500, manufactured by Shin-Etsu Chemical Co., Ltd.) was dropped (0.05 g) onto the surface of each test piece and heated for 10 minutes. After the heating, the silicone resin was stripped from the test piece. Whether the curing had been completed or not (curability) was determined on the basis of whether the silicone resin partly remained adherent to the test piece after the stripping and whether the remaining part flowed upon reception of external force.

Good: curing had been completed, and no flowing occurred upon reception of external force.

Poor: curing was incomplete, and flowing occurred upon reception of external force.

TABLE 1

| | Example | | | | Comparative Example | | |
|---|---|---|---|---|---|---|---|
| | 1 | 2 | 3 | 4 | 1 | 2 | 3 |
| Epoxy resin | 100 | 100 | 100 | 100 | 100 | 100 | 100 |
| Curing agent (acid anhydride) | 152 | 158 | 152 | 152 | 152 | 158 | 152 |
| Titanium oxide | 135 | 100 | 135 | 135 | 135 | 100 | 135 |
| Silica powder | 155 | 200 | 155 | 155 | 155 | 200 | 155 |
| Antioxidant d1 | — | — | — | — | 1.5 | 4 | 9 |
| Antioxidant d2 | 0.6 | 4 | 0.05 | 9 | — | — | — |
| Curing accelerator | 1 | 2 | 1 | 1 | 1 | 2 | 1 |
| Reflectivity Initial (%) | 98 | 97 | 90 | 91 | 97 | 96 | 92 |
| Reflectivity 180° C. × 72 hr (%) | 86 | 86 | 81 | 80 | 85 | 85 | 84 |
| Silicone resin curability | good | good | good | good | poor | poor | poor |

The results given above show that the test pieces of the Examples gave high values with respect to each of initial reflectivity and reflectivity measured after the long-term high-temperature standing. It can be seen that the test pieces of the Examples have excellent long-term high-temperature heat resistance. Furthermore, since the specific antioxidant d2 had been used, the silicone resin suffered no curing inhibition.

In contrast, the test pieces of the Comparative Examples, which had been produced using not the specific antioxidant but a phosphine antioxidant, caused curing inhibition of the silicone resin, although not inferior to the test pieces of the Examples in initial reflectivity and in long-term high-temperature heat resistance.

[Production of Optical Semiconductor Device]
Subsequently, the powdery epoxy resin compositions obtained in the Examples each were used to produce an optical semiconductor device having the configuration shown in FIG. 1. Namely, a lead frame 1 made of Alloy 42 (plated with silver) was prepared on which an optical semiconductor element (size: 0.3 mm×0.3 mm) 2 had been mounted and in which an electrode circuit formed on the metallic lead frame 1 had been electrically connected to the optical semiconductor element 2 with a bonding wire 4. Subsequently, this lead frame 1 was set in a transfer molding machine, and transfer molding was conducted using the epoxy resin composition to thereby produce an optical semiconductor device which was a unit including a reflector 3, the metallic lead frame 1, and the optical semiconductor element 2 mounted on the metallic lead frame 1, as shown in FIG. 1 (molding conditions: molding at 150° C. for 4 minutes and curing at 150° C. for 3 hours). The space within the reflector 3, in which the optical semiconductor element 2 was included, was encapsulated using a silicone resin (KER-2500, manufactured by Shin-Etsu Chemical Co., Ltd.). As a result, no curing inhibition occurred at the interface between the reflector 3 and the silicone resin, and satisfactory optical semiconductor devices having no problem were obtained.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2010-225657 filed on Oct. 5, 2010, and the contents are incorporated herein by reference.

All references cited herein are incorporated by reference herein in their entirety.

Also, all the references cited herein are incorporated as a whole.

The epoxy resin composition for an optical semiconductor device of the invention is useful, for example, as a material for forming a reflector that reflects light emitted from an optical semiconductor element mounted in an optical semiconductor device encapsulated with a silicone resin.

DESCRIPTION OF REFERENCE NUMERALS AND SIGNS

| | |
|---|---|
| 1 | Metallic lead frame |
| 2 | Optical semiconductor element |
| 3 | Reflector |
| 4 | Bonding wire |

What is claimed is:

1. An epoxy resin composition for an optical semiconductor device having an optical semiconductor element mounting region and having a reflector that surrounds at least a part of the region, the epoxy resin composition being an epoxy resin composition for forming the reflector, the epoxy resin composition comprising the following ingredients (A) to (D):
(A) an epoxy resin;
(B) a curing agent;
(C) a white pigment; and
(D) at least one antioxidant selected from the group consisting of 2,6-di-t-butyl-4-methylphenol, triethylene glycol bis[3-(3-t-butyl-5-methyl-4-hydroxyphenyl)propionate], 1,6-hexanediol bis[3-(3,5-di-t-butyl-4-hydroxyphenyl)propionate], 2,4-bis(n-octylthio)-6-(4-hydroxy-3,5-di-t-butylanilino)-1,3,5-triazine, pentaerythrityl tetrakis[3-(3,5-di-t-butyl-4-hydroxyphenyl)propionate], 2,2-thiodiethylene bis[3-(3,5-di-t-butyl-4-hydroxyphenyl)propionate], octadecyl 3-(3,5-di-t-butyl-4-hydroxyphenyl)propionate, N,N'-hexamethylene(3,5-di-t-butyl-4-hydroxyhydrocinnamamide), diethyl 3,5-di-t-butyl-4-hydroxybenzylphosphonate, 1,3,5-trimethyl-2,4,6-tris (3,5-di-t-butyl-4-hydroxybenzyl)benzene, alkyl esters of thiopropionic acid and derivatives thereof, alkylpropionic acid esters of thiobisphenols and derivatives thereof, mercaptobenzimidazole and derivatives thereof, bis(2,2,6,6-tetramethyl-4-piperidyl)sebacate, bis(1,2,2,6,6-pentamethyl-4-piperidyl)sebacate, 1,2,3,4-tetrakis(2,2,6,6-tetramethyl-4-piperidyloxycarbonyl) butane, succinic acid/dimethyl-1-(2-hydroxyethyl-4-hydroxy-2,2,6,6-tetramethylpiperidine polycondensates, 1-(3,5-di-t-butyl-4-hydroxyphenyl)-1,1-bis(2,2,6,6-tetramethyl-4-piperidyloxycarbonyl) pentane, N,N-bis(3-aminopropyl)ethylenediamine, 4-benzoyloxy-2,2,6,6-tetramethylpiperidine, and bis (octyl-2,2,6,6-tetramethyl-4-piperidyl)sebacate.

2. The epoxy resin composition for an optical semiconductor device according to claim 1, wherein the ingredient (D) is contained in an amount of 0.01 to 10 parts by weight per 100 parts by weight of the epoxy resin as the ingredient (A).

3. The epoxy resin composition for an optical semiconductor device according to claim 1, wherein the white pigment as the ingredient (C) is titanium oxide.

4. The epoxy resin composition for an optical semiconductor device according to claim 1, which further contains an inorganic filler in addition to the ingredients (A) to (D).

5. The epoxy resin composition for an optical semiconductor device according to claim 1, wherein a surface of the reflector formed from the epoxy resin composition has a light reflectivity of 80% or higher in a wavelength range of from 450 to 800 nm.

6. A lead frame for an optical semiconductor device, the lead frame having an optical semiconductor element mounting region and having a reflector that surrounds at least a part of the region, wherein the reflector is formed from the epoxy resin composition for an optical semiconductor device according to claim 1.

7. An optical semiconductor device comprising:
the lead frame for an optical semiconductor device according to claim 6; and
an optical semiconductor element mounted on a predetermined position in the lead frame.

8. The optical semiconductor device according to claim 7, wherein a region including the optical semiconductor element surrounded by the reflector is encapsulated with a silicone resin.

* * * * *